United States Patent
Stecker et al.

(10) Patent No.: US 8,367,459 B2
(45) Date of Patent: Feb. 5, 2013

(54) ORGANIC SEMICONDUCTOR INTERFACE PREPARATION

(75) Inventors: Lisa H. Stecker, Vancouver, WA (US); Kanan Puntambekar, Portland, OR (US); Kurt Ulmer, Vancouver, WA (US)

(73) Assignee: Sharp Laboratories Of America, Inc., Camas, WA (US)

( * ) Notice: Subject to any disclaimer, the term of this patent is extended or adjusted under 35 U.S.C. 154(b) by 0 days.

(21) Appl. No.: 12/968,102

(22) Filed: Dec. 14, 2010

(65) Prior Publication Data

US 2012/0146002 A1 Jun. 14, 2012

(51) Int. Cl.
*H01L 51/00* (2006.01)
(52) U.S. Cl. ............................... 438/99; 257/E51.007
(58) Field of Classification Search ........... 257/E51.005, 257/40, E51.006, E51.007; 438/99
See application file for complete search history.

(56) References Cited

U.S. PATENT DOCUMENTS

| 6,949,762 | B2 * | 9/2005 | Ong et al. ........................ 257/40 |
| 2004/0124416 | A1 * | 7/2004 | Knipp et al. .................... 257/72 |
| 2010/0314614 | A1 * | 12/2010 | Bale et al. ....................... 257/40 |

FOREIGN PATENT DOCUMENTS

| JP | 2008060115 | 3/2008 |
| JP | 2008072041 | 3/2008 |
| JP | 2009131951 | 6/2009 |
| JP | 2010232480 | 10/2010 |
| WO | WO2008/131836 A1 * | 11/2008 |
| WO | WO2008131836 A1 | 11/2008 |

OTHER PUBLICATIONS

Whiting, Arias, "Chemically modified ink-jet printed silver electrodes for organic field-effect transistors", Applied Physics Letters 95, 253302 (2009), Published Dec. 2009.

* cited by examiner

*Primary Examiner* — Julio J Maldonado
*Assistant Examiner* — Daniel Shook
(74) *Attorney, Agent, or Firm* — Law Office of Gerald Maliszewski; Gerald Maliszewski

(57) ABSTRACT

A method is provided for preparing an interface surface for the deposition of an organic semiconductor material, in the fabrication of an organic thin film transistor (OTFT). A substrate is provided and a gate electrode is formed overlying the substrate. A gate dielectric is formed overlying the gate electrode. Then, source (S) and drain (D) electrodes are formed overlying the gate dielectric, exposing a gate dielectric channel interface region between the S/D electrodes. Subsequent to exposing the OTFT to a $H_2$ or $N_2$ plasma, a self-assembled organic monolayer is formed overlying the S/D electrodes. Finally, an active organic semiconductor layer is formed over the S/D electrodes and gate dielectric channel interface. The OTFT may be exposed to plasma either before or after the formation of the S/D electrodes.

13 Claims, 7 Drawing Sheets

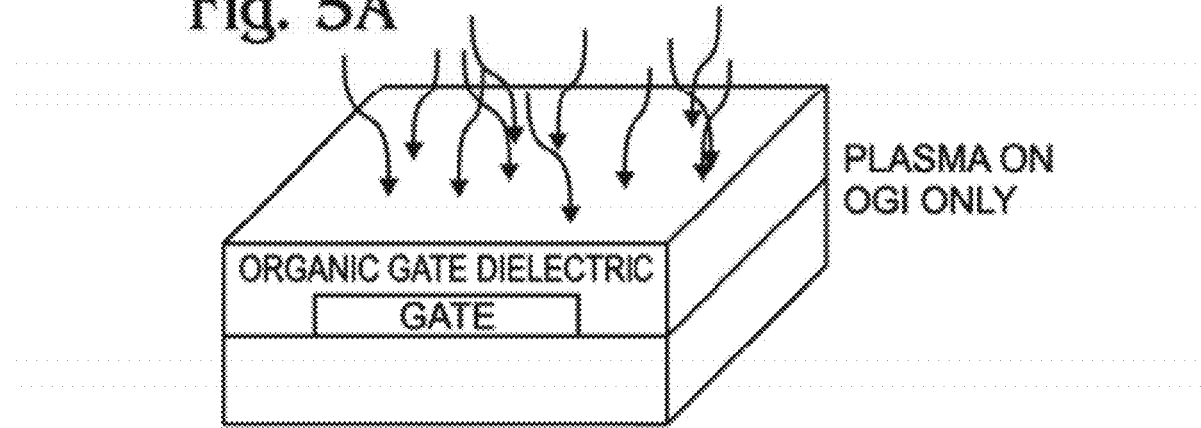
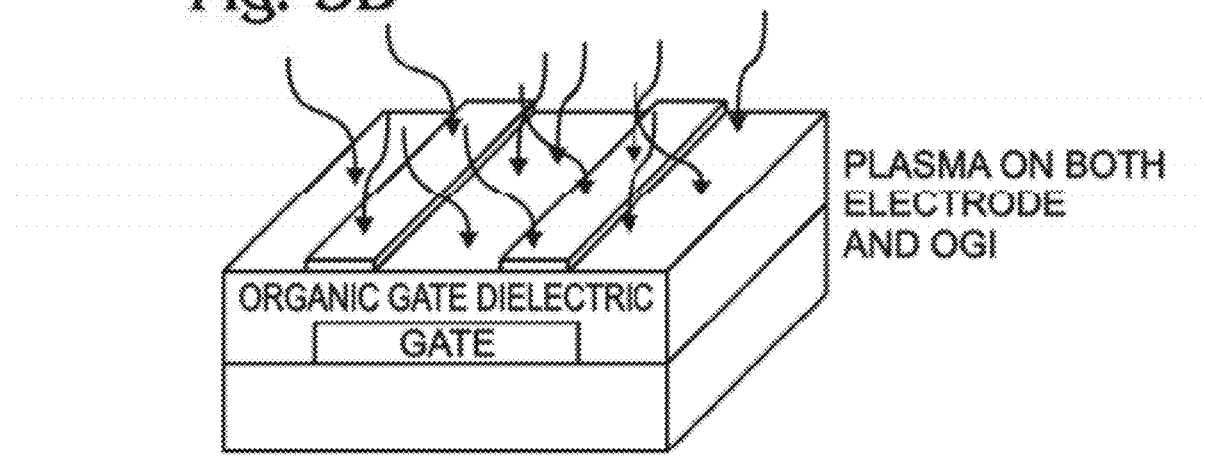
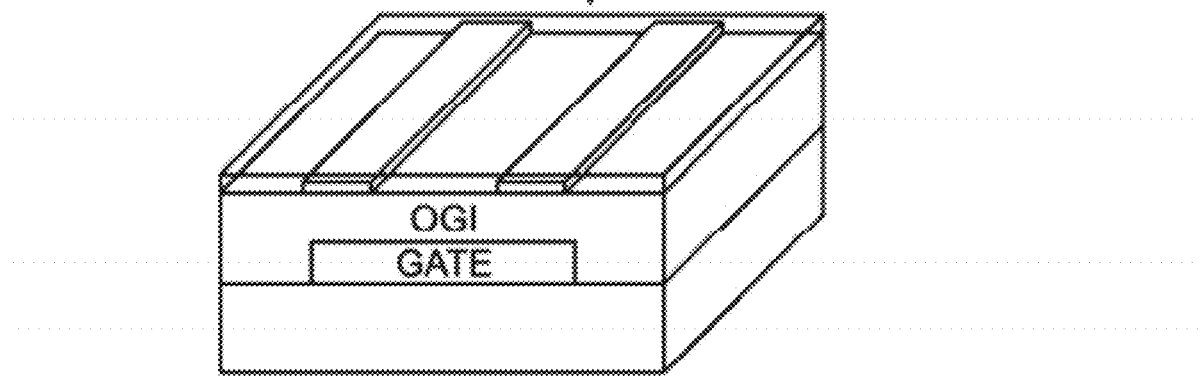

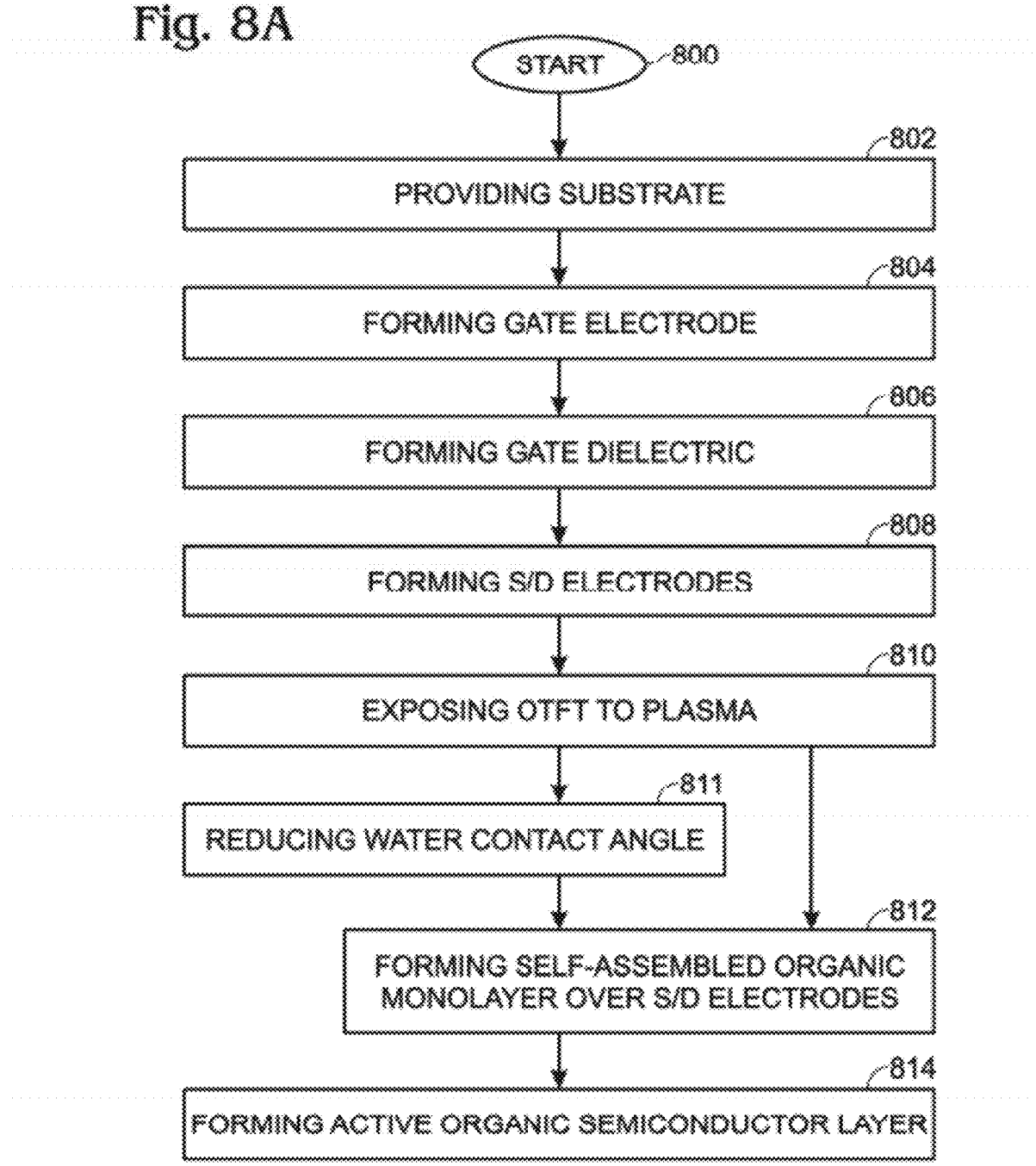

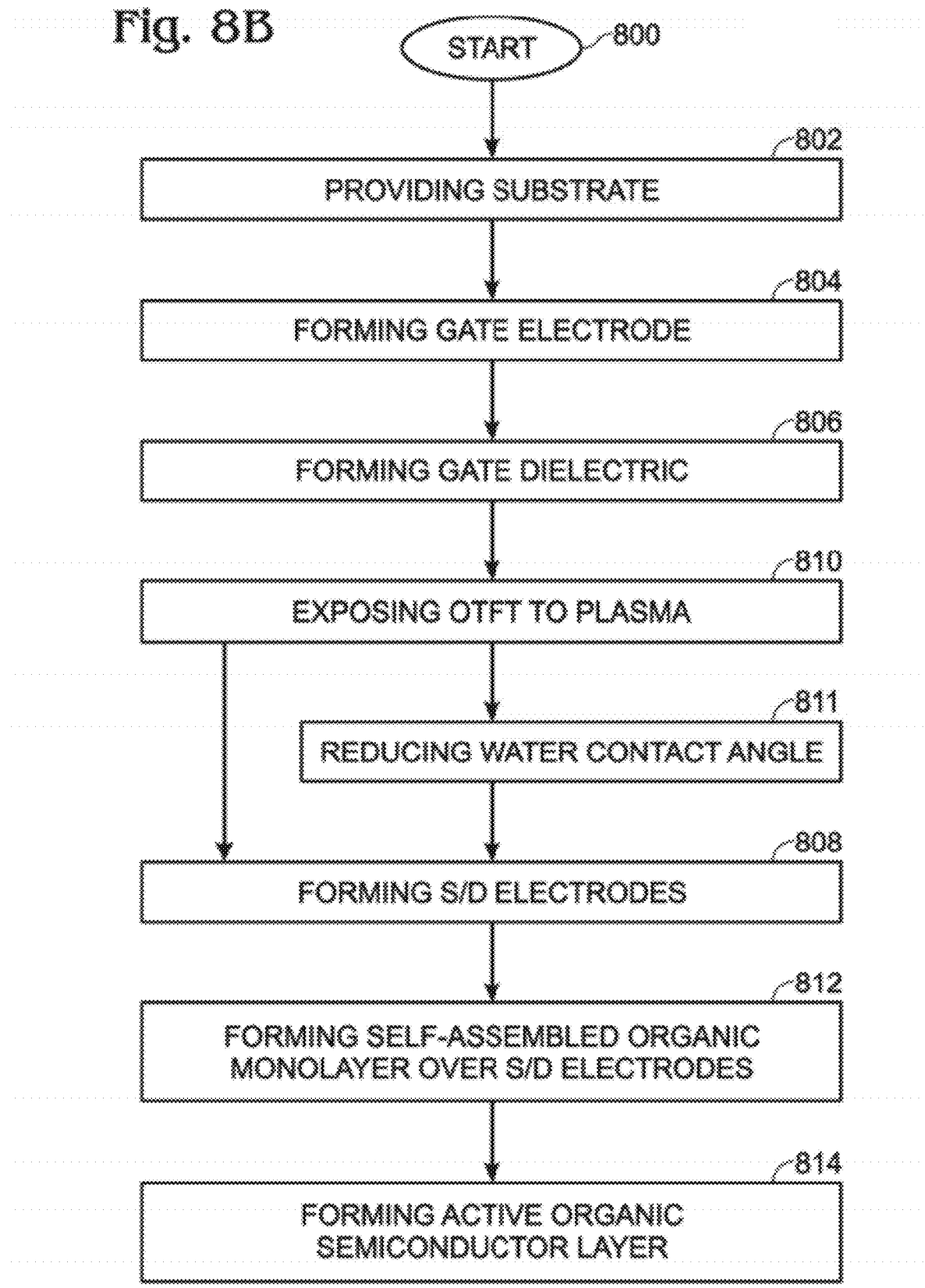

ORGANIC SEMICONDUCTOR INTERFACE PREPARATION

BACKGROUND OF THE INVENTION

1. Field of the Invention

This invention generally relates to integrated circuit (IC) fabrication and, more particularly, to an organic thin film transistor (OTFT) made by plasma treating organic semiconductor interface surfaces.

2. Description of the Related Art

As noted in Wikipedia, an organic field-effect transistor (OFET) is a transistor that uses an organic semiconductor in its channel. OTFTs are a type of OFET. OTFTs can be prepared either by vacuum evaporation of small molecules, by solution-casting of polymers or small molecules, or by mechanical transfer of a peeled single-crystalline organic layer onto a substrate. These devices have been developed to realize low-cost, large-area electronic products. OTFTs have been fabricated with various device geometries.

FIG. 1 is a partial cross-sectional view of a bottom gate TFT (prior art). The most commonly used device geometry is a bottom gate with top drain and source electrodes, because this geometry is similar to the thin-film silicon transistor (TFT) using thermally grown $Si/SiO_2$ oxide as gate dielectric. In contrast to a metal-insulator-semiconductor FET (MISFET) or metal-semiconductor FET (MESFET), in a top gate TFT the source and drain electrodes are directly deposited onto the conducting channel (a thin layer of semiconductor). Then a thin film of insulator is deposited between the semiconductor and the metal gate contact. A bottom gate TFT reverses the structure.

Organic polymers, such as poly(methyl-methacrylate) (PMMA), CYTOP, PVA, polystyrene, parylene, etc., can be used as a dielectric. OFETs employing numerous aromatic and conjugated materials as the active semiconducting layer have been reported, including small molecules such as rubrene, tetracene, pentacene, diindenoperylene, perylenediimides, tetracyanoquinodimethane (TCNQ), and polymers such as polythiophenes (especially poly 3-hexylthiophene (P3HT)), polyfluorene, polydiacetylene, poly 2,5-thienylene vinylene, poly p-phenylene vinylene (PPV). These can be deposited via vacuum or solution base methods, the later being of interest for printed electronics. The newer generation of solution processable organic semiconductors consists of blends of high performance small molecule and polymeric molecules for optimum performance and uniformity.

Various strategies are being devised to improve the device performance of all solution processed, printed organic transistor devices. One of the crucial elements for improving device performance is optimization of the semiconductor and source/drain electrode interfaces in order to obtain good ohmic contacts with very low contact resistance. In the case of organic semiconductor TFTs, the metal source drain electrodes are typically coated with a surface treatment layer (e.g., a thiol layer) in order to tune the energy level alignment and reduce the energy barrier for charge injection. These surface treatments rely on pristine metal surfaces for optimum effectiveness. This condition is easily possible in the case of evaporated metals, and reducing the time between the deposition and the surface treatment steps and has been shown to work well.

In the case of printed organic transistor devices, the metal is typically deposited using some solvent based ink with a number of additives that enable good ink printing properties. Organic printed electronics also use a solution and/or print process to deposit the semiconductor and dielectric TFT layers. Inkjet (IJ) printing is commonly used. Metallic silver nanoparticle (NP) based inks are currently the most popular candidate for printing the gate and source-drain layers of organic devices. In the case of printed metals, however, it is hard to obtain a clean pristine surface for two reasons: (i) the electrodes are typically annealed in air for 15-30 minutes to drive off the solvents and sinter the metal NPs; and, (ii) a residue of solvents and additives from the inks typically results in contamination of the metal surface. This leads to a non-ideal surface treatment and, consequently, results in poor contact properties.

The morphology and patterning of the organic semiconductor (OSC) layer of an OTFT is another challenging problem. Two key areas of research involve optimization of the grain growth in the OTFT channel region, and the isolation of the channel region of the device from the surrounding areas. To successfully IJ print an OSC layer, the solution must be optimized, as well as the surface energy over a large area of the substrate, to accurately control the extent of the OSC drop spread and uniformity. This is essential so that the consequent morphology is as desired and consistent from device to device.

It would be advantageous if the surfaces of printed electrodes and dielectric material could be treated to improve the quality of the interface with a subsequently deposited organic semiconductor.

It would be advantageous if the above-mentioned treatment process could also improve the uniformity and size of organic semiconductor crystal grains, for better device performance.

SUMMARY OF THE INVENTION

Described herein is a process that employs the use of forming gas plasma directly on printed metal source/drain electrodes of an organic thin film transistor (OTFT). The electrodes are designated to come into direct contact with a semiconductor material, either through direct application or through a conduction and/or adhesion of a promoter layer such as a thiol treatment, or other solubilizing or functionalizing materials. The forming gas plasma optimizes the electrode surface and prepares it for successful functionalization by reducing the metal surface. The plasma treatment modifies the surface work function, increases the contact angle on the electrode surface, reduces the contamination of the metal surface, and leads to the successful reduction of the source-drain contact barrier.

The plasma processing can be performed at very low temperatures, and does not require the use of high cost or specialized equipment, or high vacuum technology. It can be employed with the addition of a single short step using standard plasma cleaning equipment. While organic semiconductor materials are used as an example, the plasma treatment is not limited to only organic TFTs, but can be applied to the use of any printed metal in printed electronics applications.

Accordingly, a method is provided for preparing an interface surface for the deposition of an organic semiconductor material, in the fabrication of an organic thin film transistor (OTFT). A substrate is provided and a gate electrode is formed overlying the substrate. A gate dielectric is formed overlying the gate electrode. Then, source (S) and drain (D) electrodes are formed overlying the gate dielectric, exposing a gate dielectric channel interface region between the S/D electrodes. Subsequent to exposing the OTFT to a plasma, a self-assembled organic monolayer is formed overlying the S/D electrodes. Finally, an active organic semiconductor layer is formed over the S/D electrodes and gate dielectric channel interface.

If the gate dielectric is an organic semiconductor gate dielectric, the OTFT may be exposed to the plasma prior to forming the S/D electrodes. In another aspect, the OTFT is exposed to the plasma after forming the S/D electrodes. If so, the gate dielectric may, or may not be masked from plasma exposure. Typically, the OTFT is exposed to either an $H_2$ or $N_2$ plasma.

Additional details of the above-described method, a printed OTFT, and a printed OTFT with silver source and drain electrodes are provided below.

BRIEF DESCRIPTION OF THE DRAWINGS

FIGS. 5A through 5C are a schematic of two process flow variations that include the treatment of gate dielectric surfaces with plasma.

FIGS. 8A and 8B are flowcharts illustrating a method for preparing an interface surface in the deposition of an OTFT organic semiconductor material.

DETAILED DESCRIPTION

Figure 1:
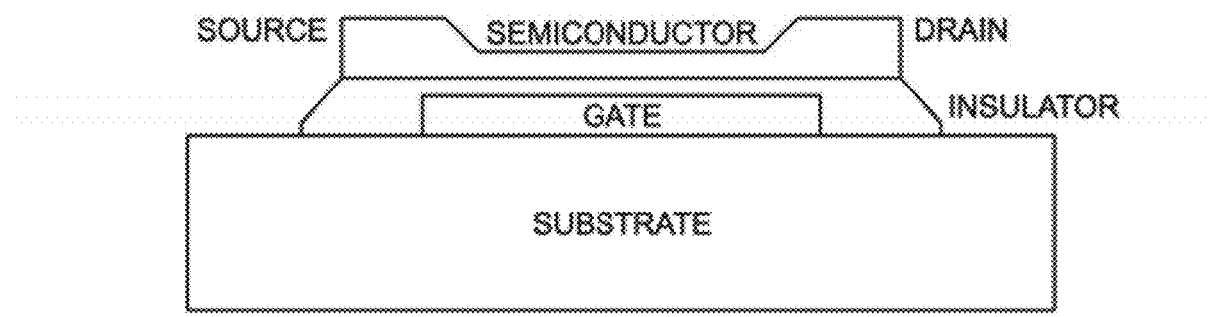
FIG. 1 is a partial cross-sectional view of a bottom gate TFT (prior art).
Figure 2:
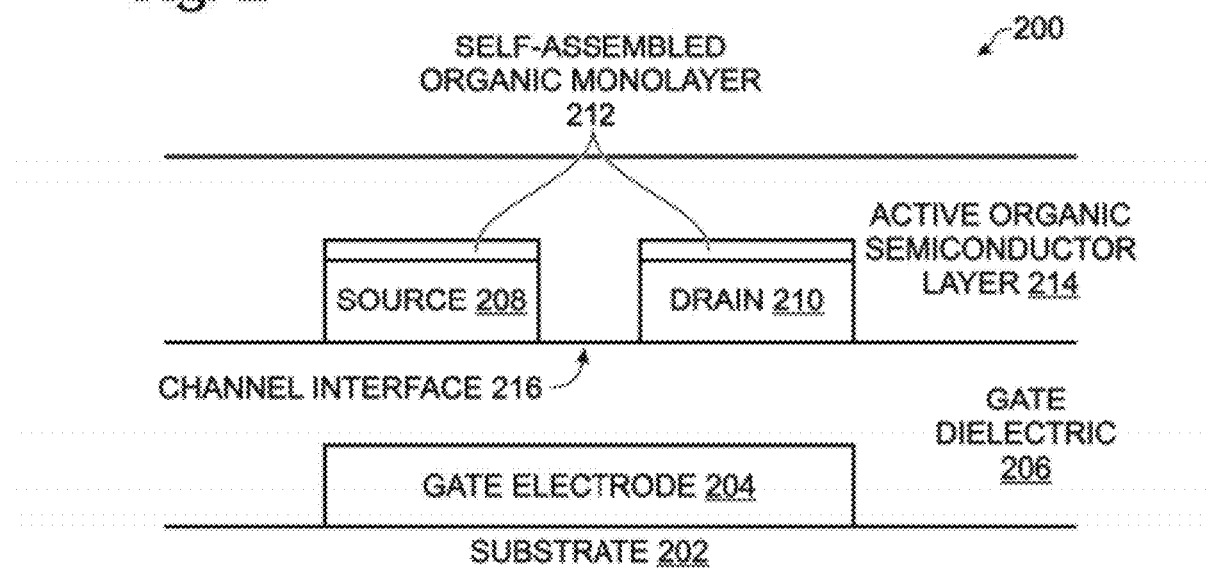
FIG. 2 is a partial cross-sectional view of a printed organic thin film transistor (OTFT).

FIG. 2 is a partial cross-sectional view of a printed organic thin film transistor (OTFT). The OTFT 200 comprises a substrate 202 and a gate electrode 204 printed over the substrate 202. Although not explicitly shown, an insulator may be employed between the substrate 202 and gate electrode 204, as would be well understood in the art. A gate dielectric 206 is printed over the gate electrode 204. The gate dielectric 206 may be an organic semiconductor, ultra violet (UV) cross-linked organic polymer, or thermally cross-linked polymer.

Source (S) 208 and drain (D) 210 electrodes are printed over the gate dielectric 206. A number of metals, such as gold or silver may be deposited using a printing process. A self-assembled organic monolayer 212 overlies the S/D electrodes 208/210. As explained in more detail below, thiol is one example of a self-assembled monolayer 212. In one example, if the S electrode 208 and D electrode 210 are silver, they may have a work function of greater than about 5.3.

An active organic semiconductor layer 214 is printed over the S/D electrodes 208/210 and gate dielectric channel interface 216. The active organic semiconductor 214 may be a small molecule organic semiconductor, polymeric organic semiconductor, or a blend of the above-mentioned materials. As explained in more detail below, the OTFT 200 has a linear mobility of greater than about 0.6 square centimeters per volt second ($cm^2/Vs$), and a saturation mobility of greater than about 0.6 $cm^2/Vs$.

Functional Description

The OTFT interface plasma gas treatment has application to the processing of printable electronics, in which the metalized electrodes have been deposited through printing or stamping techniques. The technique can be employed with any type substrate, such as glass, semiconductor, ceramic, or flexible plastic, or Teflon. The source metal can be, but is not limited to, silver (Ag), gold (Au), platinum (Pt), or copper (Cu) based inks, or other metal based ink. Once deposited, the electrode inks are cured according to manufactures specifications using heating and/or UV exposure in specified ambient.

Through the use of the plasma surface treatment, electrodes formed using a printing process can be made to have the same interface quality as evaporated electrodes. The metal nanoparticles in an ink solvent tend to have polymeric shells around them, to form good dispersions in organic solvents. After printing as lines, the metal is annealed in air to drive off the solvent and also to sinter the particles. Thus, given the likely inherent presence of organic impurities and/or oxidized surface layers present in the printed metal electrodes, the plasma treatment normalizes any variation between the printed and evaporated cases.

Directly prior to any functionalization step for such electrodes, the substrate surface is exposed to a plasma. For example, an $H_2$ plasma may be derived through the use of commercial forming gas mixtures of $N_2H_2$ gas, or other dilute hydrogen gas sources. The power for the plasma may be low, and will work for RF powers as low as 10 watts (W). Exposure time may be very short, between 15 second to 2 minutes, and no elevated process temperatures are required. Physical shielding of channel area may be employed during plasma exposure to protect dielectric interface from ion bombardment damage in the case of bottom—gate devices. Alternately, as explained below, the channel area is unshielded.

As noted in Wikipedia, forming gas is a mixture of hydrogen (up to 5.7%) and nitrogen. It is sometimes called a "dissociated ammonia atmosphere" due to the reaction which generates it:

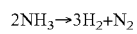

$2NH_3 \rightarrow 3H_2+N_2$

It can be also manufactured by thermal cracking of ammonia in an ammonia cracker or forming gas generator. Forming gas is used as an atmosphere for processes that need the properties of hydrogen gas without the explosion hazard. It is used in chambers for gas hypersensitization, a process in which photographic film is heated in forming gas to drive out moisture and oxygen and to increase the base fog of films, especially ones sensitive to contaminants. Quite often forming gas is used in furnaces during annealing for the thermal treatment of steel, because it can prevent the oxidation of the surface. These particular plasma gases are of particular value as $O_2$ plasma is not an option when using metals such as silver or aluminum, due to oxidation concerns.

After completion of $H_2$ plasma exposure to metalized electrodes, device processing may continue immediately, so as to maximize electrode surface conditioning. Thiol, or some other organic solution, functionalization steps typically occur immediately after the $H_2$ plasma step mentioned above.

One verification of the success of the surface reduction step is in the hydrophobic response of the metal surface to water exposure, with improvement in this contact angle (>90°) after the surface functionalization, as compared to the case where there has been no plasma step.

As noted in Wikipedia, the contact angle is the angle at which a liquid/vapor interface meets a solid surface. Most often the concept is illustrated with a small liquid droplet resting on a flat horizontal solid surface. The shape of the droplet is determined by the Young's relation. The contact angle plays the role of a boundary condition. Contact angle is measured using a contact angle goniometer.

If a liquid is very strongly attracted to a solid surface (for example, water on a strongly hydrophilic solid), the droplet will completely spread out on the solid surface and the contact angle will be close to 0°. Less strongly hydrophilic solids will have a contact angle up to 90°. On many highly hydrophilic surfaces, water droplets will exhibit contact angles of 0° to 30°. If the solid surface is hydrophobic, the contact angle will be larger than 90°.

Figure 3A:
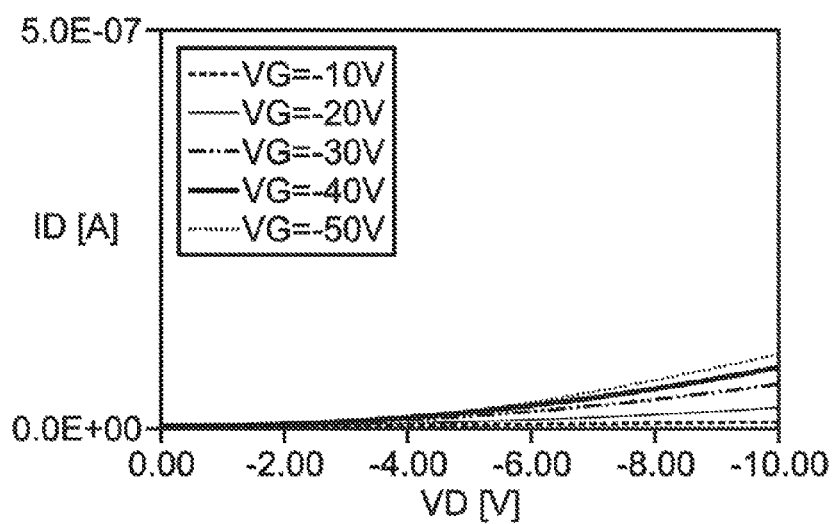
FIGS. 3A through 3D are graphs of OTFT device voltage vs. current, with and without plasma treatment.
Figure 3B:
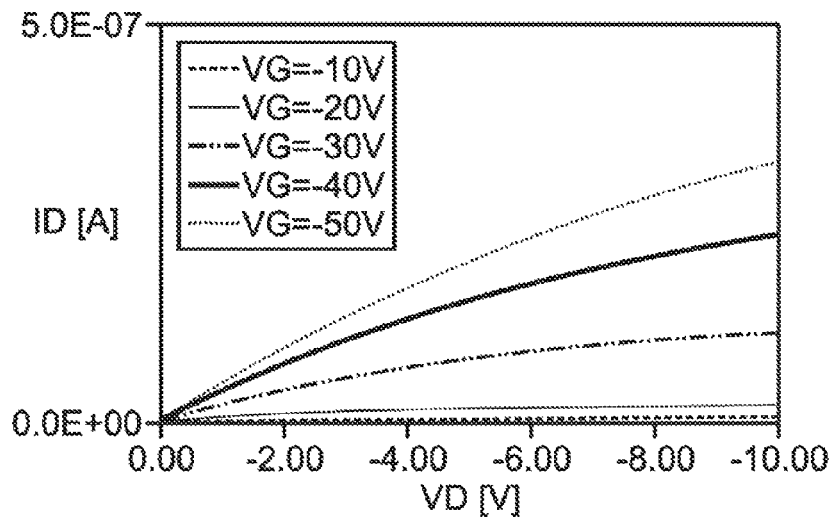
Figure 3C:
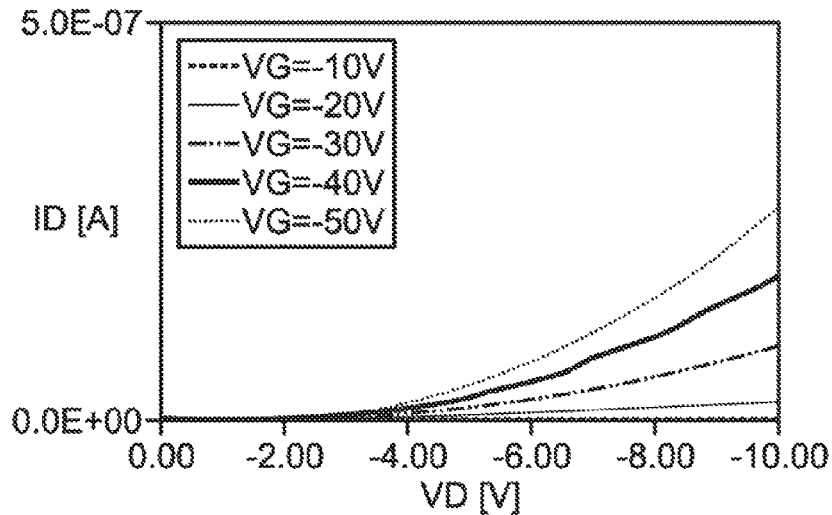
Figure 3D:
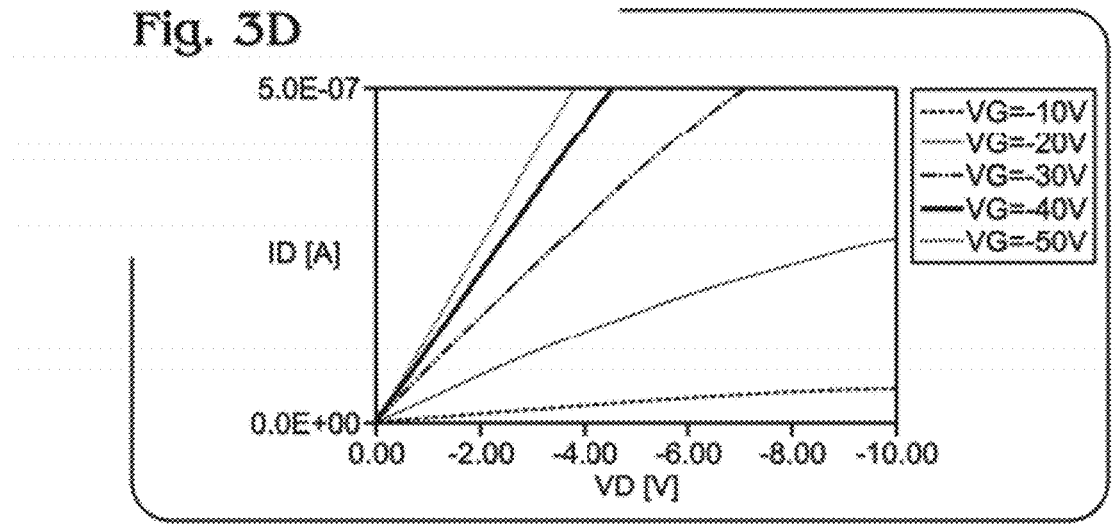

FIGS. 3A through 3D are graphs of OTFT device voltage vs. current, with and without plasma treatment. FIG. 3A depicts measurements from a Ag electrode printed with ink from a first manufacturer, and FIG. 3B depicts a printed first manufacturer Ag ink electrode treated with low power forming gas plasma. FIG. 3C depicts measurements from a Ag electrode, printed with ink from a second manufacturer, with standard processing, and FIG. 3D depicts a standard printed second manufacturer Ag ink electrode treated with low power forming gas plasma.

A significant improvement in device performance is obtained due to a reduction in the contact resistance, a result that has proven to be consistent and repeatable. Two different Ag metal inks were used from different manufacturers. In both cases a high contact resistance was observed in the non-plasma treated case as reflected in the high concavity of the ID-VD curves at low VD biases. In both cases a distinct improvement is observed with the plasma step. No additional steps are required to achieve better interface performance, other that exposure of printed and cured electrode to forming gas plasma prior to electrode functionalization.

In addition to improving the interface between the active organic semiconductor and S/D electrodes, the plasma gas treatment can also improve device performance in organic TFT systems by treating the organic dielectric layer in the channel region with specified plasma exposure. The result of such treatment improves the interface between the dielectric and the semiconductor, thus resulting in improved transistor performance.

Application WO2008131836A1, PROCESS FOR PREPARING AN ELECTRONIC DEVICE, by Mueller et al., discusses use of oxygen, Ar, and CF4 plasma for the treatment of source/drain metals areas. Mueller et al. explicitly warn against any exposure to the channel region to plasma. To avoid plasma exposure, Mueller et al. suggest the use of a protective layer over the channel region, on the assumption that the effect of plasma on the gate dielectric is likely to be only detrimental. The damage warned against is in the physical degradation of the surface or bond modifications that can lead to severe charge trapping during OTFT operation and degradation in the device performance. Completely contrary to this description, a plasma treatment is explained herein that is used to promote organic semiconductor grain growth in the channel region. This result has two broad implications—(i) the improvement in the grain size of the organic semiconductor; and, (ii) the elimination of an additional step to protect the gate dielectric in the channel region, as the same plasma treatment can be applied to both the channel and source/drain regions for improving the device performance.

Further, device improvement can also be obtained by treating just the TFT channel region of the exposed gate dielectric alone, but not plasma treating the electrode surfaces. Table 1 lists transistor data measured for substrate treatment variations performed after dielectric deposition, but before top electrode or semiconductor deposition.

TABLE 1

| Surface Treatment | Linear Mobility $cm^2/Vs$ | Saturation Mobility $cm^2/Vs$ |
|---|---|---|
| Organic dielectric, no treatment | 0.34 +/− 0.13 | 0.55 +/− 0.36 |
| Organic dielectric + $N_2H_2$ plasma | 0.72 +/− 0.14 | 0.7 +/− 0.08 |
| Organic dielectric + $N_2$ plasma | 0.72 +/− 0.09 | 0.74 +/− 0.07 |

Figure 4A:
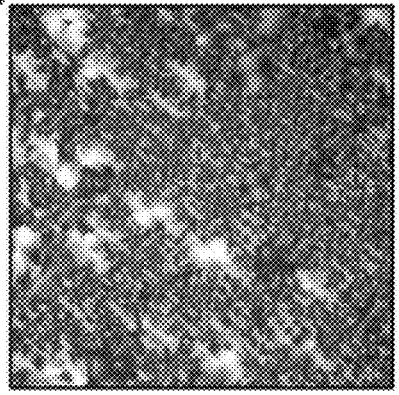
FIGS. 4A through 4C depict optical phase contrast images of semiconductor crystallization, with and without plasma treatment.
Figure 4B:
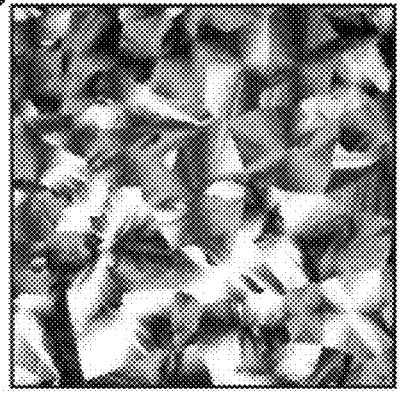
Figure 4C:

FIGS. 4A through 4C depict optical phase contrast images of semiconductor crystallization, with and without plasma treatment. FIG. 4A depicts an as-deposited organic dielectric. FIG. 4B depicts an organic dielectric treated with forming gas plasma, and FIG. 4C an organic dielectric treated with $N_2$ plasma.

After exposing the organic dielectric to either $N_2$ or forming gas plasma and then depositing organic semiconductor with appropriate post deposition curing, the semiconductor grain size shows an increase in size and discernable improvement in uniformity, as compared to untreated dielectric. Improved crystallization leads to better semiconductor performance, and this result is supported with data. Another indication of surface energy changes that result from this surface treatment is in contact energy data. Untreated organic dielectric surface display a contact angle of 70°-90° as deposited. After forming gas or $N_2$ plasma exposure, the contact angle measure with $H_2O$ is in the range of 35° to 50°.

Incorporated into standard organic TFT processing, the surface treatments introduce plasma exposure from either $N_2$ or forming gas ($N_2H_2$ consisting of >90% $N_2$, <10% $H_2$), to the organic dielectric surface prior to creation of the dielectric/semiconductor interface. This can be done for printable electronic process flow, or for conventional spin-on technology. The exposure can be performed through downstream, barrel, or conventional plasma chamber equipment using low power (20 W-100 W) plasma for generally short duration (ten seconds up to over one minute exposure), under vacuum across a wide range of flow rates. This treatment may occur either before, or after the printing or deposition of metal electrodes or gate material has been introduced. No bias of the plasma is necessary.

FIGS. 5A through 5C are a schematic of two process flow variations that include the treatment of gate dielectric surfaces with plasma. In a typical bottom gate organic transistor case, an organic dielectric insulator (OGI), or inorganic gate dielectric is deposited after the gate electrode deposition. This plasma treatment can be performed on the dielectric as shown in FIG. 5A, or can be applied to the substrate after source/drain metal deposition, and patterning or printing (FIG. 5B). Expedient deposition of the next layer should then proceed, either metal (if it has not been deposited already) or the semiconductor itself. The metal layer can be deposited using a printing, evaporation, or sputtered source. Overall, the exposure of treated dielectric surface to air is typically minimized prior to deposition of semiconductor layer, and any excessive time delays between depositions are typically avoided. Methods for semiconductor layer deposition can be spin-on, aerosol, or printing. After semiconductor deposition, all remaining processing steps may proceed as conventional processing equipment and materials dictate. No further specialized process or modification is required. Both methods result in device improvements as measured using mobility measurements. In one aspect, the organic semiconductor and dielectric are deposited via spin coating, and the metal is evaporated via a shadow mask.

The contact resistances of a plasma treated and untreated OTFTs are as follows:

>10×10³ ohm·cm² with no forming gas treatment case; and,

~0.2-0.5×10³ ohm·cm² with forming gas treatment.

The OTFT mobilities for both the cases are:

<0.1 cm²/Vs with no forming gas treatment; and,

~0.5-1.0 cm²/Vs with forming gas treatment.

The results indicate that the contact resistance is dramatically affected by introduction of the forming gas plasma treatment in the process flow. This can be seen both by Id-Vd curves of FIGS. 3A to 3D, and in the contact resistance estimates listed above. These numbers also show that the forming gas treatment is critical for the device operation. The reduction in the contact resistance is directly indicative of the improved interface between the source/drain electrodes and the organic semiconductor. This is likely due to improved deposition of the intermediate self-assembled monolayer on the S/D electrodes after the forming gas treatment, since this is the only difference in the process flow between the two cases. The deposition of the self-assembled monolayer is the thiol bonding that occurs between the molecules and the metal surface.

Figure 6:
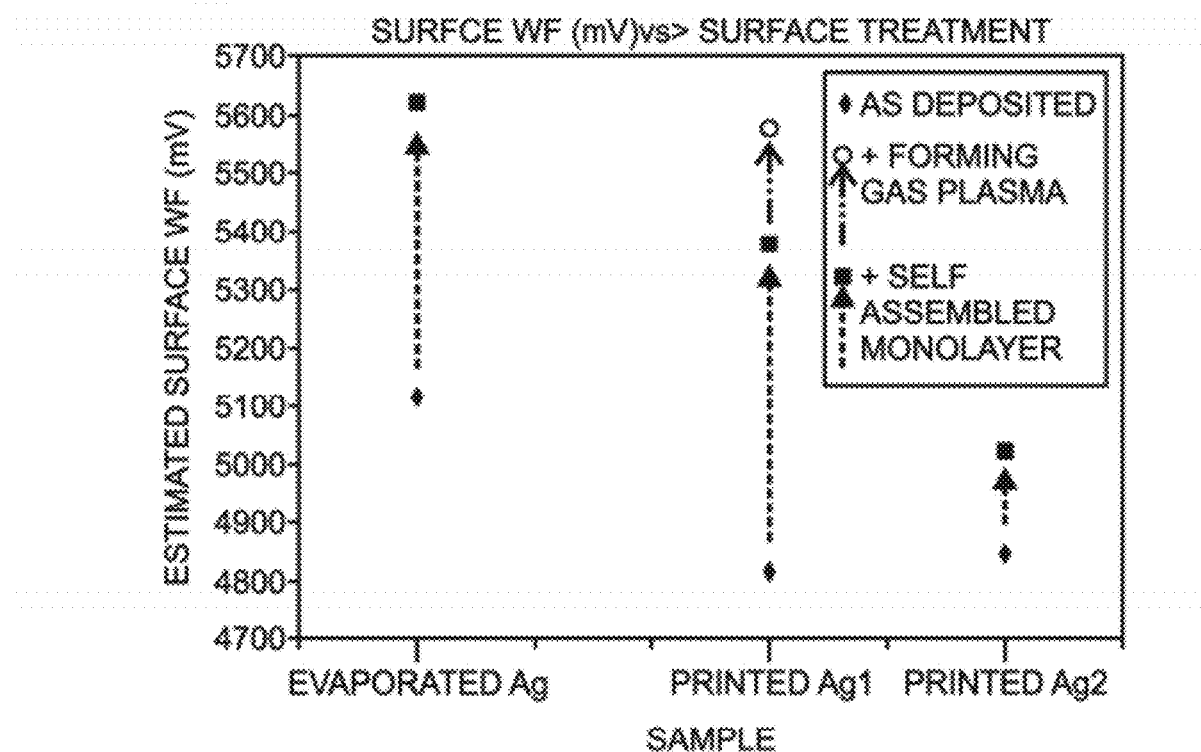
FIG. 6 is a graph depicting the work function (WF) of evaporated silver, printed silver, and both evaporated and printed silver, following a plasma treatment and self-assembled monolayer treatment.

FIG. 6 is a graph depicting the work function (WF) of evaporated silver, printed silver, and both evaporated and printed silver, following a plasma treatment and self-assembled monolayer treatment. The plasma treatment also effects the surface potential (surface work function) measurements of the metal electrodes. Kelvin probe measurements performed on the surface of the metal electrodes provide the surface work function of the metal electrodes. Any change in the surface work function as a result of a surface treatment is a direct measure of surface modification. Also, in this case, the electrode surface being evaluated is the interface with the organic semiconductor. Thus, the work function mismatch between the metal and the HOMO of the organic semiconductor at this surface may result in poor alignment and affect charge injection. In the case of a p-type organic semiconductor for instance, it is desirable to align the work function of the metal surface at the highest occupied molecular orbit (HOMO) of the molecule for efficient charge injection without significant interface barrier. However, it is hard to obtain such high work functions in case of printed metals.

Results show that the forming gas treatment can be used as effective mechanism to push the work function of the printed metal surfaces higher, and make them comparable to their evaporated counter parts as shown in the figure. Also, the relative change in the work function of the surface after the self-assembled monolayer deposition is seen to be non-ideal in the case of no forming gas treatment, but very comparable to the ideal evaporated metal case in sample using forming gas. Although evaporated and printed silver are used as an example, it should be noted that the relative change in the work function as result of the forming gas treatment is specific to a given metal. In case of silver, the plasma treatment drives the work function higher. Also note that in the "as deposited" case of the printed silver electrodes, it is likely that the surface has some oxidation on it (from the anneal step) and, thus, is more a "partially oxidized silver" surface as opposed to a true silver surface.

Figure 7A:
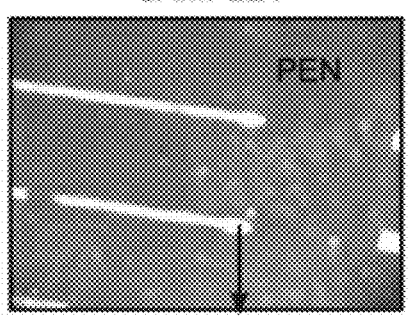
FIGS. 7A and 7B are photos of plasma treated and untreated silver with fluorescence tagging used as evidence of the thiol bonding.
Figure 7B:
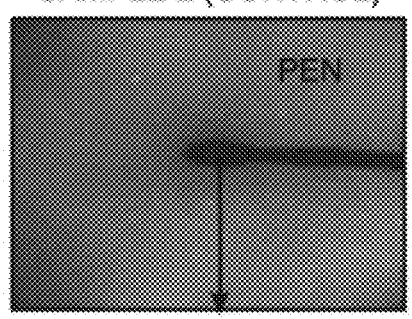

FIGS. 7A and 7B are photos of plasma treated and untreated silver with fluorescence tagging used as evidence of the thiol bonding. In one experiment the effect of the forming gas treatment on the printed metal surface (Ag in this case) was evaluated by fluorescence bead (FB) tagging. The main steps of the process are:

i. Treat printed Ag metal surface with forming gas plasma;
ii. Immerse in buffer (1× PBS) with 1 uM (micro-molar) thiolated (SH)-DNA-Biotin (molecule 1);
iii. This results in the binding of molecule 1, to the metal surface only;
iv. Rinse in water;
v. Add 1:1000 dilution of SA-Florescence bead (molecule 2);
vi. Rinse in water;

The desired results are that molecule 1 should preferentially bind only to the metal areas. Molecule 2 should preferentially bind only to molecule 1. Thus, fluorescent beads should be present on the printed metal surface only if molecule 1 is present on the surface. Unsuccessful thiol binding (molecule 1) results in no binding sites for the molecule 2, which has the fluorescence bead (FB) attached to it. Thus, fluorescence is indicative of successful thiol binding of molecule 1 (FIG. 7A). This binding is the same as the thiol bonding of the self-assembled monolayers in the fabrication of OTFTs, and this result can be used to directly verify the effect of the forming gas treatment on the metal surface.

It should be noted here that the possibility of the non-site specific binding of molecule 2 is ruled out as well, as shown in FIG. 7B. That is, molecule 2 with the florescence tag cannot attach to the metal surface if molecule 1 is not already present on the surface. Also, note that the non-specific binding of molecule 2 on the plastic substrate (PEN) surface is unrelated to the experiment.

Alternatively stated, FIGS. 7A and 7B are confocal microscope images of the printed silver wires with the above-described plasma treatment. In the figures, the wires that are seen are the regions of printed silver. There are two Ag wires in FIG. 7A, and a single Ag wire in FIG. 7B. The background is PEN substrate. When the FB is tagged on the printed silver as is the case in FIG. 7A, the silver electrodes shows high brightness compared to the background. In case of FIG. 7B, the control sample, where the tagging was unsuccessful the wire is dark compared to the background. Ideally, the background should also be as dark as the wire in FIG. 7B, but some non-specific binding may occur on the PEN. This results in some background brightness in FIGS. 7A and 7B, which can be ignored for this experiment. More important, is the comparison of the wires in the two figures.

FIGS. 8A and 8B are flowcharts illustrating a method for preparing an interface surface in the deposition of an OTFT organic semiconductor material. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 800.

Step 802 provides a substrate. The substrate can be an electrical insulator, conductor, or semiconductor material. Step 804 forms a gate electrode overlying the substrate. Depending upon the substrate material, an insulator or dielectric may be formed between the gate electrode and substrate. Step 806 forms a gate dielectric overlying the gate electrode. The gate dielectric may be an organic semiconductor, ultra violet (UV) cross-linked organic polymers, thermally cross-linked polymers, or a blend of polymers. Step 808 forms source (S) and drain (D) electrodes overlying the gate dielectric, exposing a gate dielectric channel interface region between the S/D electrodes.

At some point in the process, Step 810 exposes the OTFT to a plasma. Subsequent to exposing the OTFT to the plasma, Step 812 forms a self-assembled organic monolayer overlying the S/D electrodes. Step 814 forms an active organic semiconductor layer overlying the S/D electrodes and gate dielectric channel interface. For example, the active organic semiconductor may be a small molecule organic semiconductor, polymeric organic semiconductor, or a blend of the above-mentioned materials. Step 814 forms the active organic semiconductor layer with crystal grains having growth and uniformity characteristics responsive to the plasma exposure.

In one aspect (see FIG. 8B), forming the gate dielectric in Step 806 includes forming an organic semiconductor gate dielectric. Then, exposing the OTFT to the plasma in Step 810 includes exposing the organic semiconductor gate dielectric to the plasma prior to forming the S/D electrodes. That is, Step 810 occurs before Step 808.

In another aspect (see FIG. 8A), Step 810 exposes the OTFT to the plasma after forming the S/D electrodes. That is, Step 810 is performed after Step 808. In this variation, the gate dielectric may, or may not masked from plasma exposure. Inorganic dielectrics are more likely to be masked than organic dielectric materials. The exposure of the OTFT to the plasma after forming the S/D electrodes also modifies the work function associated with the S/D electrodes in response to the plasma. For example, if Step 808 forms silver S/D electrodes using a printing deposition process, then modifying the S/D electrode work function in Step 814 may include creating silver S/D electrodes with a work function of greater than 5.3.

In one aspect, exposing the OTFT to the plasma in Step 810 includes exposing the OTFT to a plasma such as $H_2$ or $N_2$. If $H_2$ plasma is used, then the process may introduce a gas such as $N_2H_2$, where $N_2>90\%$ and $H_2<10\%$, or a dilute hydrogen gas source. More explicitly, exposing the OTFT to the plasma may include the following process parameters:
 a plasma power of 100 watts, or less;
 a duration of less than one minute;
 performance at room temperature; and,
 performance without a plasma bias voltage.

In one aspect, forming the gate dielectric in Step 806 includes forming the gate dielectric using a printing process. Likewise, forming the S/D electrodes in Step 808 includes using a printing process. However, the plasma treatment is not limited to just printing deposition processes. Some examples of gate dielectric and S/D electrode printing processes include inkjet printing, spin-on coating, aerosol deposition, stamping, dip-coating, and screen printing. However, other related printing processes are known in the art and would likewise be applicable.

In one aspect, forming S/D electrodes and the exposed gate dielectric channel interface region between the S/D electrodes in Step 808 includes initially forming the exposed gate dielectric channel interface region with a water contact angle in a range of about 70 to 90 degrees. Subsequent to exposing the OTFT to the plasma, Step 811 forms the exposed gate dielectric channel interface region with a water contact angle in the range of about 35 to 50 degrees.

An OTFT has been provided with an associated process for preparing an interface surface for the deposition of an organic semiconductor material. Examples of particular materials and process steps have been presented to illustrate the invention. However, the invention is not limited to merely these examples. Although bottom gate OTFT devices have been described in detail, the invention is applicable to other transistor topologies, and structures other than transistors. Other variations and embodiments of the invention will occur to those skilled in the art.

We claim:

1. In an organic thin film transistor (OTFT), a method for preparing an interface surface for the deposition of an organic semiconductor material, the method comprising:
 providing a substrate;
 forming a gate electrode overlying the substrate;
 forming a gate dielectric overlying the gate electrode;
 forming source (S) and drain (D) electrodes overlying the gate dielectric, exposing a gate dielectric channel interface region between the S/D electrodes;
 subsequent to forming the S/D electrodes, masking the gate dielectric channel interface and exposing an intermediate structure to a plasma;
 subsequent to exposing the intermediate structure to the plasma, forming a self-assembled organic monolayer overlying the S/D electrodes; and,
 forming an active organic semiconductor layer overlying the self-assembled organic monolayer and gate dielectric channel interface.

2. The method of claim 1 wherein forming the gate dielectric includes forming an organic semiconductor gate dielectric; and,
 wherein exposing the intermediate structure to the plasma includes exposing the organic semiconductor gate dielectric to the plasma prior to forming the S/D electrodes.

3. The method of claim 1 wherein exposing the intermediate structure to the plasma includes exposing the intermediate structure to a plasma selected from a group consisting of $H_2$ and $N_2$.

4. The method of claim 3 wherein exposing the intermediate structure to $H_2$ plasma includes introducing a gas selected from a group consisting of $N_2/H_2$, where $N_2>90\%$ and $H_2<10\%$, and dilute hydrogen gas sources.

5. The method of claim 1 wherein exposing the intermediate structure to the plasma includes exposing the intermediate structure as follows:
 to a plasma power of 100 watts, or less;
 for a duration of less than one minute;
 at room temperature; and,
 without a plasma bias voltage.

6. The method of claim 1 wherein forming the gate dielectric includes forming the gate dielectric using a printing process; and,
 wherein forming the S/D electrodes includes forming the S/D electrodes using a printing process.

7. The method of claim 6 wherein forming the gate dielectric and S/D electrodes using printing processes includes using printing processes selected from a group consisting of inkjet printing, spin-on coating, aerosol deposition, stamping, dip-coating, and screen printing.

8. The method of claim 1 wherein forming S/D electrodes and the exposed gate dielectric channel interface region between the S/D electrodes includes forming the exposed gate dielectric channel interface region with a water contact angle in a range of about 70 to 90 degrees; and,
 the method further comprising:
 subsequent to exposing the intermediate structure to the plasma, forming the exposed gate dielectric channel interface region with the water contact angle in a range of about 35 to 50 degrees.

9. The method of claim 1 wherein forming the gate dielectric includes forming the gate dielectric from a material selected from a group consisting of organic dielectric insulators (OGIs), ultra violet (UV) cross-linked organic polymers, and thermally cross-linked polymers.

10. The method of claim 1 wherein forming the active organic semiconductor includes forming the active organic semiconductor from a material selected from a group consisting of small molecule organic semiconductors, polymeric organic semiconductors, and blends of the above-mentioned materials.

11. The method of claim 1 wherein forming the active organic semiconductor layer includes forming the active organic semiconductor layer with crystal grains having growth and uniformity characteristics responsive to the plasma exposure.

12. The method of claim 1 wherein exposing the intermediate structure to the plasma after forming the S/D electrodes includes modifying a work function associated with the S/D electrodes in response to the plasma.

13. The method of claim 12 wherein forming S/D electrodes includes forming silver S/D electrodes using a printing deposition process; and,
wherein modifying the S/D electrode work function includes creating silver S/D electrodes with a work function of greater than 5.3.

* * * * *